(12) United States Patent
Shyu et al.

(10) Patent No.: US 7,541,847 B2
(45) Date of Patent: Jun. 2, 2009

(54) POWER-DIODE DRIVER HAVING EXPANSIBLE ISOLATED SUB-DRIVERS USING SINGLE POWER SOURCE

(75) Inventors: Kuo-Kai Shyu, Hsinchu County (TW); Ko-Wen Jwo, Taipei (TW); Bo-Guang Zhu, Nantou County (TW)

(73) Assignee: National Central University, Jhongi, Taoyuan County (TW)

( * ) Notice: Subject to any disclaimer, the term of this patent is extended or adjusted under 35 U.S.C. 154(b) by 62 days.

(21) Appl. No.: 11/727,901

(22) Filed: Mar. 28, 2007

(65) Prior Publication Data

US 2008/0231344 A1    Sep. 25, 2008

(30) Foreign Application Priority Data

Mar. 22, 2007  (TW)  .............................. 096110012

(51) Int. Cl.
*H03B 1/00*   (2006.01)
(52) U.S. Cl. .................. 327/108; 327/111; 327/168
(58) Field of Classification Search ............... None
See application file for complete search history.

(56) References Cited

U.S. PATENT DOCUMENTS 4,728,817 A  *  3/1988  Jessee et al. ................ 327/109

* cited by examiner

*Primary Examiner*—Lincoln Donovan
*Assistant Examiner*—An T Luu
(74) *Attorney, Agent, or Firm*—Troxell Law Office PLLC

(57) ABSTRACT

A power-diode driver uses a single power source to supply power to the sub-drivers inside. The sub-drivers are well isolated so that they can be safely and easily expanded by connecting to other device or driver. Thus, the power-diode driver has a changeable turn-on time and a highly modulated assembly. And, hence, the present invention is suitable for mass producing reliable power-diode drivers.

2 Claims, 1 Drawing Sheet

US 7,541,847 B2

POWER-DIODE DRIVER HAVING EXPANSIBLE ISOLATED SUB-DRIVERS USING SINGLE POWER SOURCE

FIELD OF THE INVENTION

The present invention relates to a power-diode driver; more particularly, relates to providing inner sub-drivers with power through a single direct current power source and transferring power and control signal in a high speed with the sub-drivers isolated for flexible expansion.

DESCRIPTION OF THE RELATED ARTS

When a control signal is transferred in an electric/electronic control, a high-power output is usually isolated from control drivers for insulation. The devices used in such a system may include: (1) photo couplers; and, (2) piezoelectric devices.

Concerning the photo coupler, its switching frequency is hard to reach over $10^6$ hertz; and, thus, a current in a light-emitting diode (LED) within is usually increased to obtain a required frequency. As a result, operation characteristic is changed and the system becomes unstable and its life time is shortened. Besides, the photo coupler needs an independent auxiliary power source at its secondary side. Hence, it is impossible to control multiple photo coupler with a single auxiliary power source for various controls. Such a situation increases inconvenience. And, a driving with a longer turn-on time required is hard to be achieved by the photo coupler too.

In the other hand, the piezoelectric device may be designed to use no independent auxiliary power source at its secondary side. However, its best switching frequency for operation is very narrow and is easily affected by the surrounding temperature; and its energy transformation efficiency is not good enough either. Therefore, the piezoelectric device is not suitable to be used with a wide bandwidth or in an environment having wide-range temperature changes. Hence, the prior arts do not fulfill all users' requests on actual use.

SUMMARY OF THE INVENTION

The main purpose of the present invention is to provide power to inner sub-drivers of a power-diode driver through a single direct current power source and to transfer power and control signal in a high speed, with the sub-drivers isolated for flexible expansion.

To achieve the above purpose, the present invention is a power-diode driver having expansible isolated sub-drivers using a single power source, comprising an input, a trigger pulse transformer and an output, coordinated with a plurality of triggers, a plurality of capacitance, a plurality of resistance, a plurality of diodes and a plurality of transistors, where the trigger pulse transformer is a small EE13 driver or an even smaller driver.

Therein, the grounded input is connected with a first diode and a parallelly connected first resistance, both of which are connected with a base of a first NPN transistor. The first NPN transistor has a collector connected with a second resistance and a first inverting Schmitt trigger; and an emitter connected with a first capacitance and a parallelly connected third resistance, both of which are grounded. The first inverting Schmitt trigger is connected with a fourth resistance, which is connected with a second diode. The second diode is connected with a second inverting Schmitt trigger, a fifth resistance and a grounded second capacitance. The second inverting Schmitt trigger and the fifth resistance are connected with a third inverting Schmitt trigger. The third inverting Schmitt trigger is connected with a third diode and a parallelly connected sixth resistance, both of which are connected with a base of a second NPN transistor. The second NPN transistor has an emitter connected with an eighth resistance and a third capacitance; and a collector connected with the trigger pulse transformer. And, the eighth resistance and the third capacitance are grounded.

Therein, the trigger pulse transformer has a primary side coil connected with a fourth diode and a seventh resistance; and a secondary side coil connected with a sixth diode and a fifth diode. The sixth diode and the fifth diode are connected with a grounded ninth resistance; a fourth capacitance; an emitter of a third PNP transistor; a base of a fourth PNP transistor; and a seventh diode. The fourth capacitance is connected with the emitter of the third PNP transistor; the base of the grounded fourth PNP transistor; and the seventh diode. The third PNP transistor has the emitter connected with the base of the fourth PNP transistor, and the seventh diode; a collector connected with a tenth resistance; and a base connected with a collector of the fourth PNP transistor, a base of a fifth NPN transistor, a twelfth resistance, an eleventh resistance, and the tenth resistance. The seventh diode is connected with an emitter of the fourth PNP transistor; a collector of the fifth NPN transistor; an eighth diode; a fifth capacitance; a sixth capacitance; and a Zener diode. The fifth capacitance, the sixth capacitance and the Zener diode have a parallel connection. The fourth PNP transistor has the base connected with the seventh diode; the emitter connected with the collector of the fifth NPN transistor, the eighth diode, the fifth capacitance, the sixth capacitance, and the Zener diode; and the collector connected with the base of the fifth NPN transistor, the twelfth resistance, the eleventh resistance, and the tenth resistance. The tenth resistance is connected with the base of the fifth NPN transistor, the twelfth resistance and the grounded eleventh resistance. The eleventh resistance is connected with a base of a sixth NPN transistor; and the twelfth resistance. The twelfth resistance is connected with a base of a fifth NPN transistor; a base of a sixth NPN transistor; and a grounded thirteenth resistance. The fifth NPN transistor has the collector connected with the eighth diode, the fifth capacitance, the sixth capacitance, and the Zener diode; and an emitter connected with the eighth diode, a ninth diode, and a collector of the sixth NPN transistor. The sixth NPN transistor has the base connected with the grounded thirteenth resistance; the collector connected with the eighth diode, and the ninth diode; and a grounded emitter. The eighth diode is connected with the fifth capacitance, the sixth capacitance, the Zener diode and the ninth diode. And, the fifth capacitance, the sixth capacitance and the Zener diode are grounded.

And, therein, the grounded output is connected with the eighth diode; the ninth diode; the collector of the sixth NPN transistor; and the emitter of the fifth NPN transistor.

Accordingly, a novel power-diode driver having expansible isolated sub-drivers using a single power source is obtained, where, through absorbing a counter-electromotive force by the primary side coil of the trigger pulse transformer, a power and a signal are passed to the secondary side coil with a requested voltage.

BRIEF DESCRIPTION OF THE DRAWING

The present invention will be better understood from the following detailed description of the preferred embodiment according to the present invention, taken in conjunction with the accompanying drawing, in which.

DESCRIPTION OF THE PREFERRED EMBODIMENT

Figure 1:
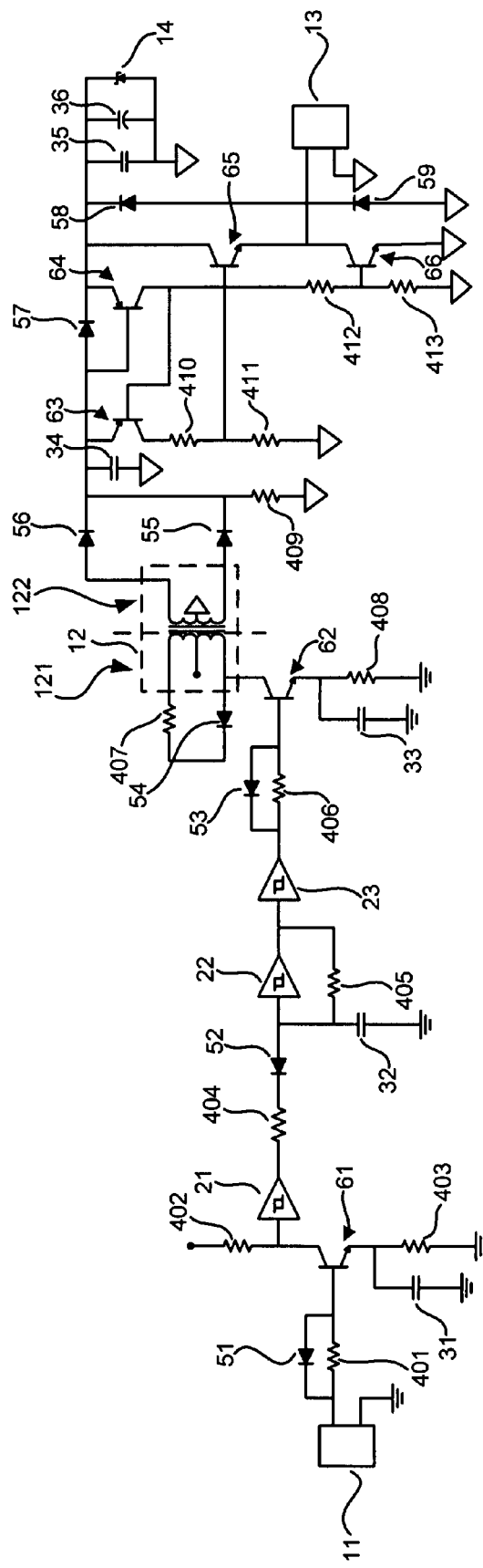
FIG. 1 is the structural view showing the preferred embodiment according to the present invention.

The following description of the preferred embodiment is provided to understand the features and the structures of the present invention.

Please refer to FIG. 1, which is a structural view showing a preferred embodiment according to the present invention. As shown in the figure, the present invention is a power-diode driver having expansible isolated sub-drivers using a single power source, comprising an input 11, a trigger pulse transformer 12 and an output 13, coordinated with a plurality of triggers 21~23, a plurality of capacitance 31~36, a plurality of resistance 401~413, a plurality of diodes 51~59 and a plurality of transistors 61~66, where the trigger pulse transformer 12 is a transformer smaller than EE13 transformer and each component in the present invention is able to be further connected with resistance, capacitance, inductance, diode and/or transistor to improve applications in actual needs. Through absorbing a counter-electromotive force by the primary side coil 121 of the trigger pulse transformer 12, a power and a signal are passed to the secondary side coil 122 of the trigger pulse transformer 12 with a requested voltage.

The input 11 receives a control signal from a single chip or a control system. A terminal of the input 11 is grounded and another terminal of the input 11 is connected with a first diode 51 and a parallelly connected first resistance 401.

The first diode 51 and the parallelly connected first resistance 401 are connected with a first NPN transistor 61, where the first NPN transistor 61 is connected with the first diode 51 and the parallelly connected first resistance 52 through a base of the first NPN transistor 61.

The first NPN transistor 61 is connected with a second resistance 402 and a first inverting Schmitt trigger 21 through a collector of the first NPN transistor 61; the first NPN transistor 61 is connected with a third resistance 403 and a first capacitance 31 through an emitter of the first NPN transistor 61; and the first NPN transistor 61 is used to improve a transformation efficiency between high and low potentials of a current.

The first inverting Schmitt trigger 21 is connected with a fourth resistance 404, where the first inverting Schmitt trigger 21 is used to make the phase of the signal turned back to the same phase of the signal inputted from the input 11.

The fourth resistance 404 is connected with a second diode 52.

The second diode 52 is connected with a second inverting Schmitt trigger 22, a fifth resistance 405 and a second capacitance 32, where a terminal of the second capacitance 32 is grounded and the second inverting Schmitt trigger 22 produces a high-frequency oscillation through a charging and a discharging by the fifth resistance 405 and the second capacitance 32. The second inverting Schmitt trigger 22 and the fifth resistance 405 are connected with a third inverting Schmitt trigger 23, where the third inverting Schmitt trigger 23 is used to change a wave form of the signal to obtain a reverse phase toward the phase of the signal inputted from the input 11.

The third inverting Schmitt trigger 23 is connected with a third diode 53 and a parallelly connected sixth resistance 406.

The third diode 53 and the parallelly connected sixth resistance 406 are connected with a second NPN transistor 62, where the second NPN transistor 62 is connected with the third diode 53 and the sixth resistance 406 through a base of the second NPN transistor 62.

The second NPN transistor 62 is used to drive coils to pass energy and signal through a current heightened. The second NPN transistor 62 is connected with an eighth resistance 408 and a third capacitance 33 through an emitter of the second NPN transistor 62, where the eighth resistance 408 and the third capacitance 33 have a parallel connection and are grounded. And, the second NPN transistor 62 is connected with the trigger pulse transformer 12 through a collector of the second NPN transistor 62.

The trigger pulse transformer 12 is connected with a fourth diode 54 and a seventh resistance at a primary side coil 121 of the trigger pulse transformer 12; and the trigger pulse transformer 12 is connected with a fifth diode 55 and a sixth diode 56 at a secondary side coil 122 of the trigger pulse transformer 12.

The fifth diode 55 and the sixth diode 56 are connected together to be connected with a ninth resistance 409, a fourth capacitance 34, a third PNP transistor 63, a seventh diode 57 and a fourth PNP transistor 64, where a terminal of the ninth resistance 409 and a terminal of the fourth capacitance 34 are grounded; the third PNP transistor 63 is connected with the fifth diode 55 and the sixth diode 56 through an emitter of the third PNP transistor 63; and the fourth PNP transistor 64 is connected with the fifth diode 55 and the sixth diode 56 through a base of the fourth PNP transistor 64.

The third PNP transistor 63 is connected with the ninth resistance 409, the fourth capacitance 34, the seventh diode 57 and the fourth PNP transistor 64 through the emitter of the third PNP transistor 63; the third PNP transistor 63 is connected with the fourth PNP transistor 64, a fifth NPN transistor 65, a twelfth resistance 412, an eleventh resistance 411 and a tenth resistance 410 through a base of the third P NP transistor 63; and the third PNP transistor 63 is connected with the tenth resistance 410 through a collector of the third PNP transistor 63, where the fourth PNP transistor 64 is connected with the emitter of the third PNP transistor 63 through the base of the fourth PNP transistor 64; the fourth PNP transistor 64 is connected with the base of the third PNP transistor 63 through the collector of the fourth PNP transistor 64; and the fifth NPN transistor 65 is connected with the base of the third PNP transistor 63 through the base of the fifth NPN transistor 64.

The seventh diode 57 is connected with the fourth PNP transistor 64, the fifth NPN transistor 65, the eighth diode 58, a fifth capacitance 35, a sixth capacitance 36 and a Zener diode 14, where the fifth capacitance 35, the sixth capacitance 36 and the Zener diode 14 are parallelly connected; the fourth PNP transistor 64 is connected with the seventh diode 57 through the base and an emitter of the fourth PNP transistor 64; the fifth NPN transistor 65 is connected with the seventh diode 57 through a collector of the fifth NPN transistor 65; and the fifth capacitance 35, the sixth capacitance 36 and the Zener diode 14 are grounded.

The fourth PNP transistor 64 is connected with the fifth NPN transistor 65, the eighth diode 58, the fifth capacitance 35, the sixth capacitance 36 and the Zener diode 14 through the emitter of the fourth PNP transistor 64; and the fourth PNP transistor 64 is connected with the tenth resistance 410, the eleventh resistance 411, the twelfth resistance 412 and the fifth NPN transistor 65 through the collector of the fourth PNP transistor 64, where the fifth NPN transistor 65 is connected with the collector of the fourth PNP transistor 64 through the base of the fifth NPN transistor 65; and the fifth NPN transistor 65 is connected with the emitter of the fourth PNP transistor 64 through the collector of the fifth NPN transistor 65.

The tenth resistance 410 is connected with the fifth NPN transistor 65, the twelfth resistance 412 and the eleventh resistance 411, where the fifth NPN transistor 65 is connected with the tenth resistance 410 through the base of the fifth NPN transistor 65; and the eleventh resistance 411 is grounded.

The twelfth resistance 412 is connected with a sixth NPN transistor 66 and a thirteenth resistance 413, where the sixth NPN transistor 66 is connected with the twelfth resistance 412 through a base of the sixth NPN transistor 66; and the thirteenth resistance 413 is grounded.

The fifth NPN transistor 65 is connected with the eighth diode 58, the fifth capacitance 35, the sixth capacitance 36 and the Zener diode 14 through the collector of the fifth NPN transistor 65; the fifth NPN transistor 65 is connected with the twelfth resistance 412 and the eleventh resistance 411 through the base of the fifth NPN transistor 65; and the fifth NPN transistor 65 is connected with the eighth diode 58, a ninth diode 59 and the sixth NPN transistor 66 through an emitter of the fifth NPN transistor 65, where the sixth NPN transistor 66 is connected with the eighth diode 58 through a collector of the sixth NPN transistor 66; and the sixth NPN transistor 66 is connected with the emitter of the fifth NPN transistor 65 through the collector of the sixth NPN transistor 66.

The eighth diode 58 is connected with the sixth NPN transistor 66, the ninth diode 59, the fifth capacitance 35, the sixth capacitance 36 and the Zener diode 14, where the ninth diode 59, the fifth capacitance 35, the sixth capacitance 36 and the Zener diode 14 are grounded.

And, the sixth NPN transistor 66 is connected with the thirteenth resistance 413 through the base of the sixth NPN transistor 66; and the sixth NPN transistor 66 is grounded through an emitter of the sixth NPN transistor 66.

A terminal of the output 13 is connected with the ninth diode 59, the eighth diode 58, the fifth NPN transistor 65 and the sixth NPN transistor 66, where the fifth NPN transistor 65 and the sixth NPN transistor 66 are connected with the output 13 through the emitter of the fifth NPN transistor 65 and the collector of the sixth NPN transistor 66, respectively. And, another terminal of the output 13 is grounded.

Thus, a novel expansible isolated power-diode driver using a single power source is obtained through the above structure.

When the signal is inputted from the input 11 by the single chip or the control system, the first NPN transistor 61 enhances the transformation efficiency between high and low potentials of the current; and a low voltage of the current is transformed into a high voltage. Because the phase at the collector is reverse to the phase at the base, the first inverting Schmitt trigger 21 is used to return the phase of the signal to the original phase of the signal inputted from the input 11. The second inverting Schmitt trigger 22 produces a high-frequency oscillation through a charging and a discharging by the fifth resistance 405 and the second capacitance 32, respectively. Then, the second inverting Schmitt trigger 22 outputs a low potential when the voltage is high; or, reversely, the second inverting Schmitt trigger 22 outputs a high potential when the voltage is low. Therein, the oscillation has a high frequency more than $10^6$ hertz; and, after the wave form of the signal is changed by the third inverting Schmitt trigger 23, a phase reverse to the phase of the inputted signal is obtained with the high frequency. The second NPN transistor 62 heightens the current to drive the coils of the trigger pulse transformer 12 to pass the energy. Under the high transformation efficiency between high and low potentials of the current, when the second NPN transistor 62 is closed, a very high counter-electromotive force is produced. At the moment, a circuit protection is provided by the fourth diode 54 and the seventh resistance 407, where the counter-electromotive force is absorbed by the primary side coil 121 to be passed to the secondary side coil. Thus, the energy is fully used; an efficiency of the whole circuit is enhanced; and, a reacting time of the whole circuit is improved.

In addition, a circuit is designed in the present invention to modify the wave form at the secondary side coil 122 into a standard square waveform.

In the present invention, each NPN transistor 61, 62, 65, 66 can be replaced by a field-effect transistors (FET), a metal-oxide semiconductor (MOS) or a complementary metal-oxide semiconductor (CMOS). Therein, the voltage at the sixth capacitance 36 is taken as a standard potential of a direct current to be compared with the voltage at the fourth capacitance 34. When the voltage at the fourth capacitance 34 is higher than the voltage at the sixth capacitance 36, the seventh diode 57 and the third PNP transistor 63 are turned on and the fourth PNP transistor is turned off, while the eleventh resistance 411 provides a voltage to turn on the fifth NPN transistor 65. Hence, when the fifth NPN transistor 65 is a metal oxide semiconductor field effect transistor (MOSFET) for example, a gate of the MOSFET is rapidly heightened to a high potential. On the contrary, when the voltage at the fourth capacitance 34 is lower than the voltage at the sixth capacitance 36, the seventh diode 57 and the third PNP transistor 63 a returned off and the fourth PNP transistor is turned on, while the thirteenth resistance 413 provides a voltage to turn on the sixth NPN transistor 65. Then, when the fifth NPN transistor 65 is a MOSFET for example, a gate of the MOSFET is rapidly lowered to a low potential. Hence, with the above structure, a transistor driver according to present invention is improved in efficiency. In addition, each electric component in the present invention can be further connected with a resistance, a capacitance, an inductance, a diode and/or a transistor to enhance performance in an actual need, like matching.

To sum up, the present invention is a power-diode driver having expansible isolated sub-drivers using a single power source, where a single direct current power source is required to provide inner sub-drivers with power and to transfer power and control signal in a high speed; and the present invention is suitable for mass production and has a high reliability with a changeable turn-on time and a high-modulated assembly.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A power-diode driver having expansible isolated sub-drivers using a single power source,
   comprising an input, a trigger pulse transformer and an output,
   wherein a terminal of said input is grounded;
   wherein another terminal of said input is connected with a first diode and a first resistance,
   said first diode and said first resistance having a parallel connection; said first diode and said first resistance being connected with a base of a first NPN transistor;
   a collector of said first NPN transistor being connected with a second resistance and a first inverting Schmitt trigger;
   an emitter of said first NPN transistor being connected with a first capacitance and a third resistance;
   said first capacitance and said third resistance having a parallel connection;

said first capacitance and said third resistance being grounded;
said first inverting Schmitt trigger being connected with a fourth resistance;
said fourth resistance being connected with a second diode;
said second diode being connected with a second inverting Schmitt trigger; a fifth resistance; and a second capacitance;
a terminal of said second capacitance being grounded;
said second inverting Schmitt trigger and said fifth resistance being connected with a third inverting Schmitt trigger;
said third inverting Schmitt trigger being connected with a third diode and a sixth resistance;
said third diode and said sixth resistance having a parallel connection;
said third diode and said sixth resistance being connected with a base of a second NPN transistor;
an emitter of said second NPN transistor being connected with an eighth resistance and a third capacitance;
said eighth resistance and said third capacitance being grounded;
a collector of said second NPN transistor being connected with said trigger pulse transformer;
wherein a primary side coil of said trigger pulse transformer is connected with a fourth diode and a seventh resistance;
wherein a secondary side coil of said trigger pulse transformer is connected with a sixth diode and a fifth diode,
said sixth diode and said fifth diode being connected with a ninth resistance; a fourth capacitance; an emitter of a third PNP transistor; a base of a fourth PNP transistor; and a seventh diode;
a terminal of said ninth resistance being grounded;
said fourth capacitance being connected with said emitter of said third PNP transistor; said base of said fourth PNP transistor; and said seventh diode; a terminal of said fourth capacitance being grounded;
said emitter of said third PNP transistor being connected with said base of said fourth PNP transistor; and said seventh diode;
a collector of said third PNP transistor being connected with a tenth resistance;
a base of said third PNP transistor being connected with a collector of said fourth PNP transistor; said tenth resistance; an eleventh resistance; a twelfth resistance; and a base of a fifth NPN transistor;
said seventh diode being connected with an emitter of said fourth PNP transistor; a collector of said fifth NPN transistor; an eighth diode; a fifth capacitance; a sixth capacitance; and a Zener diode;
said fifth capacitance, said sixth capacitance and said Zener diode having a parallel connection;
said base of said fourth PNP transistor being connected with said seventh diode;
said emitter of said fourth PNP transistor being connected with said collector of said fifth NPN transistor; said eighth diode; said fifth capacitance; said sixth capacitance; and said Zener diode;
said collector of said fourth PNP transistor being connected with said tenth resistance; said eleventh resistance; said twelfth resistance; and said base of said fifth NPN transistor;
said tenth resistance being connected with said eleventh resistance, said twelfth resistance and said base of said fifth NPN transistor;
a terminal of said eleventh resistance being grounded;
said eleventh resistance being connected with said base of said fifth NPN transistor; and said twelfth resistance;
said twelfth resistance being connected with a base of a sixth NPN transistor; and a thirteenth resistance;
a terminal of said thirteenth resistance being grounded;
said collector of said fifth NPN transistor being connected with said eighth diode; said fifth capacitance; said sixth capacitance; and said Zener diode;
an emitter of said fifth NPN transistor being connected with said eighth diode; a ninth diode; and a collector of said sixth NPN transistor;
said base of said sixth NPN transistor being connected with said thirteenth resistance;
said collector of said sixth NPN transistor being connected with said eighth diode and said ninth diode;
an emitter of said sixth NPN transistor being grounded;
said eighth diode being connected with said fifth capacitance; said sixth capacitance; said Zener diode; and said ninth diode;
said fifth capacitance, said sixth capacitance and said Zener diode being grounded;
wherein a terminal of said output is connected with said eighth diode; said ninth diode; said collector of said sixth NPN transistor; and said emitter of said fifth NPN transistor;
wherein another terminal of said output is grounded; and
wherein said input receives a signal and a counter-electromotive force is absorbed by said primary side coil of said trigger pulse transformer to provide a voltage to pass said signal to said secondary side coil of said trigger pulse transformer.

2. The diode driver according to claim 1, wherein said Zener diode has a voltage of 18 volts.

* * * * *